(12) United States Patent
Kim

(10) Patent No.: US 8,673,789 B2
(45) Date of Patent: Mar. 18, 2014

(54) METHOD FOR FABRICATING CARBON HARD MASK AND METHOD FOR FABRICATING PATTERNS OF SEMICONDUCTOR DEVICE USING THE SAME

(75) Inventor: Tai Ho Kim, Seongnam-si (KR)

(73) Assignee: SK Hynix Inc., Gyeonggi-do (KR)

(*) Notice: Subject to any disclaimer, the term of this patent is extended or adjusted under 35 U.S.C. 154(b) by 336 days.

(21) Appl. No.: 13/160,848

(22) Filed: Jun. 15, 2011

(65) Prior Publication Data
US 2012/0208367 A1 Aug. 16, 2012

(30) Foreign Application Priority Data
Feb. 15, 2011 (KR) .................. 10-2011-0013463

(51) Int. Cl.
*H01L 21/00* (2006.01)
(52) U.S. Cl.
USPC .......................................... 438/725; 438/723
(58) Field of Classification Search
USPC .................................. 438/723–728
See application file for complete search history.

(56) References Cited

U.S. PATENT DOCUMENTS 5,656,128 A * 8/1997 Hashimoto et al. ............. 216/47
6,740,601 B2 * 5/2004 Tan et al. ...................... 438/771

FOREIGN PATENT DOCUMENTS

| KR | 10-1998-0065203 A | 10/1998 |
| KR | 1020080060363 A | 7/2008 |
| KR | 1020090003716 A | 1/2009 |

* cited by examiner

*Primary Examiner* — Richard Booth
(74) *Attorney, Agent, or Firm* — William Park & Associates Patent Ltd.

(57) ABSTRACT

A method for fabricating a carbon hard mask layer includes: loading a substrate with a pattern target layer into a chamber; performing a primary thermal treatment on the substrate; depositing a carbon hard mask layer over the pattern target layer by using $C_xH_y$ gas to perform the primary thermal treatment; performing a secondary thermal treatment on the substrate on which the carbon hard mask layer is deposited; and performing an oxygen treatment on the carbon hard mask layer.

20 Claims, 8 Drawing Sheets

METHOD FOR FABRICATING CARBON HARD MASK AND METHOD FOR FABRICATING PATTERNS OF SEMICONDUCTOR DEVICE USING THE SAME

CROSS-REFERENCES TO RELATED APPLICATIONS

The present application claims priority under 35 U.S.C 119(a) to Korean Application No. 10-2011-0013463, filed on Feb. 15, 2011, in the Korean intellectual property Office, which is incorporated herein by reference in its entirety.

BACKGROUND

Exemplary embodiments of the present invention relate to a method for fabricating a semiconductor device, and more particularly, to a method for fabricating carbon hard mask for a semiconductor device.

In general, a semiconductor device includes a variety of active elements and passive elements. The active elements and the passive elements are implemented by patterns disposed on a substrate. Therefore, a process of forming patterns is essential in a process of fabricating a semiconductor device. In order to form patterns on a substrate, a mask pattern is formed on a pattern target layer, and an etching process is performed using the mask pattern as an etching barrier layer. A photoresist layer has been widely used as the mask pattern. However, as the integration density of the device increases, it is necessary to form the photoresist layer thinly in order to form fine patterns. A variety of materials are used for the pattern target layer. In recent years, the use of a hard mask layer having a rigid characteristic has increased.

Examples of materials used in the hard mask layer include silicon oxynitride (SiON), silicon nitride ($Si_3N_4$), and carbon (C). Among these materials, a carbon hard mask layer has an advantage in that it has selectivity to most pattern target layers because it is etched by oxygen ($O_2$). Thus, the application of the carbon hard mask layer has rapidly expanded. The use of the carbon hard mask layer in the formation of patterns is disclosed in U.S. Pat. Nos. 5,378,316 and 5,656,128. According to these documents, the carbon hard mask layer is deposited by a plasma enhanced chemical vapor deposition (PECVD) process.

In the case of using the PECVD process to deposit the carbon hard mask layer, the card hard mask layer is deposited using $C_xH_y$, e.g., $C_3H_6$ or $C_2H_2$, as source gas within a PECVD chamber at a temperature of about 300-550° C. and RF power of 1,500-2,000 W. Under those conditions, the deposited carbon hard mask layer has hydrogen bonding, where the amount of the hydrogen bonding may be changed according to the temperature. As one example, at a temperature of about 300° C., there is about 40% hydrogen in the carbon hard mask layer. When the carbon hard mask layer is deposited at a temperature of 550° C., there is about 20% hydrogen. It is known that hydrogen bonding is very unstable. Accordingly, a subsequent thermal treatment can remove hydrogen from the carbon hard mask layer, or hydrogen may be removed by having it react with an etching solution or an etching gas in a subsequent etching process.

FIG. 1 is a graph showing a pressure variation with respect to a temperature change of a chamber where a plurality of samples each having a carbon hard mask layer formed by a PECVD process are loaded. As illustrated in FIG. 1, when a thermal treatment is performed at a predetermined temperature, for example, about 600° C. or more, as indicated by "A" the pressure inside the chamber rapidly increased. Specifically, the pressure inside the chamber is increased by H or CH from the carbon hard mask layer when a hydrogen bonding within the carbon hard mask layer is broken by a high-temperature thermal treatment.

As such, when hydrogen comes out of the carbon hard mask layer in an H type or a C—H bonded type, it is accumulated at an interface between the carbon hard mask layer and a layer above the carbon hard mask layer. The accumulated H or C—H lowers adsorption force between the carbon hard mask layer and the layer disposed above the carbon hard mask layer by a subsequent etching process or thermal treatment. As a result, the layer disposed above the carbon hard mask layer may be lifted from the carbon hard mask layer.

SUMMARY

An embodiment of the present invention is directed to a method for fabricating a carbon hard mask layer, with a reduced amount of hydrogen within a carbon hard mask layer, and a method for fabricating patterns of a semiconductor device using the same.

In one embodiment, a method for fabricating a carbon hard mask layer includes: loading a substrate with a pattern target layer into a chamber; performing a primary thermal treatment on the substrate; depositing a carbon hard mask layer over the pattern target layer by using $C_xH_y$ gas to perform the primary thermal treatment; performing a secondary thermal treatment on the substrate on which the carbon hard mask layer is deposited; and performing an oxygen treatment on the carbon hard mask layer.

The chamber may be a high density plasma (HDP) chamber. In this case, the HDP chamber may include: a cooling passage configured to cool the substrate; and a chuck connected to an external bias power source.

The primary thermal treatment may be performed by introducing plasma to a surface of the pattern target layer. The plasma may include at least one of $N_2$, Ar, $NH_3$, and $N_2O$ ions and/or radicals.

As one example, the primary thermal treatment may be performed so that the temperature of the surface of the pattern target layer becomes about 550-800° C.

As another example, the primary thermal treatment may be performed so that the temperature of the surface of the pattern target layer becomes about 550-700° C.

The depositing of the carbon hard mask layer may be performed using a reaction gas comprising at least $C_xH_y$ and $O_2$ and an activation gas comprising at least Ar and $N_2$. In some cases, the $C_xH_y$ gas as the reaction gas may comprise at least one of $C_2H_2$, $C_3H_6$, and $C_5H_8$.

The depositing of the carbon hard mask layer may be performed by applying RF power of 4,000-15,000 W for forming plasma within the chamber, and applying bias power of 1,000-2,000 W for the substrate.

The secondary thermal treatment may be performed by introducing plasma with the surface of the pattern target layer. In some cases, the plasma may include at least one of $N_2$, Ar, $NH_3$, and $N_2O$ ions and/or radicals.

As one example, the secondary thermal treatment may be performed so that the temperature of the surface of the pattern target layer becomes about 550-800° C.

As another example, the secondary thermal treatment may be performed so that the temperature of the surface of the pattern target layer becomes about 550-700° C.

The depositing of the carbon hard mask layer may be performed using a reaction gas comprising at least one of $C_xH_y$ and $O_2$ and an activation gas comprising at least one of Ar and $N_2$.

The oxygen treatment on the carbon hard mask layer may be performed by applying RF power of 4,000-15,000 W for forming plasma within the chamber, and applying bias power of 300-1,000 W for the substrate.

The depositing of the carbon hard mask layer may be performed such that a carbon (C) deposition rate by the $C_xH_y$ gas is higher than a carbon (C) etching rate by the $O_2$ gas during the oxygen treatment.

The primary thermal treatment, the secondary thermal treatment, and the oxygen treatment may be repeated until a desired thickness of the carbon hard mask layer is obtained.

In another embodiment, a method for fabricating patterns of a semiconductor device includes: loading a substrate with a pattern target layer into a chamber; performing a primary thermal treatment on the substrate; depositing a carbon hard mask layer over the pattern target layer by using $C_xH_y$ gas; performing a secondary thermal treatment on the substrate in which the carbon hard mask layer is deposited; performing an oxygen treatment on the carbon hard mask layer; repeating the primary thermal treatment, the secondary thermal treatment, and the oxygen treatment until a desired thickness of the carbon hard mask layer is obtained; forming an etching mask pattern over the carbon hard mask layer; forming a carbon hard mask pattern exposing a portion of the surface of the pattern target layer through an etching process using the etching mask pattern as an etching barrier layer; and forming a final pattern by removing the exposed portion of the pattern target layer through an etching process using the carbon hard mask pattern as an etching barrier layer.

The depositing of the carbon hard mask layer may be performed using a reaction gas comprising at least one of $C_xH_y$ and $O_2$ and an activation gas comprising at least one of Ar and $N_2$.

BRIEF DESCRIPTION OF THE DRAWINGS

The above and other aspects, features, and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 1:
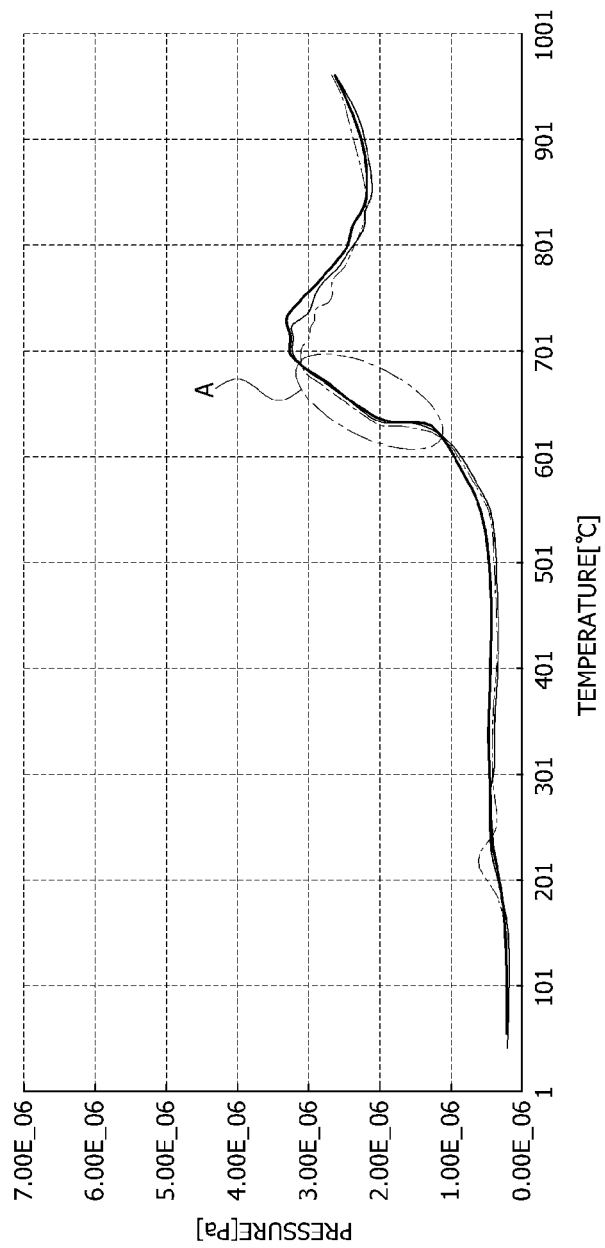
FIG. 1 is a graph showing a pressure variation with respect to a temperature change of a chamber where a plurality of samples, each having a carbon hard mask layer formed by a PECVD process, are loaded.
Figure 2:
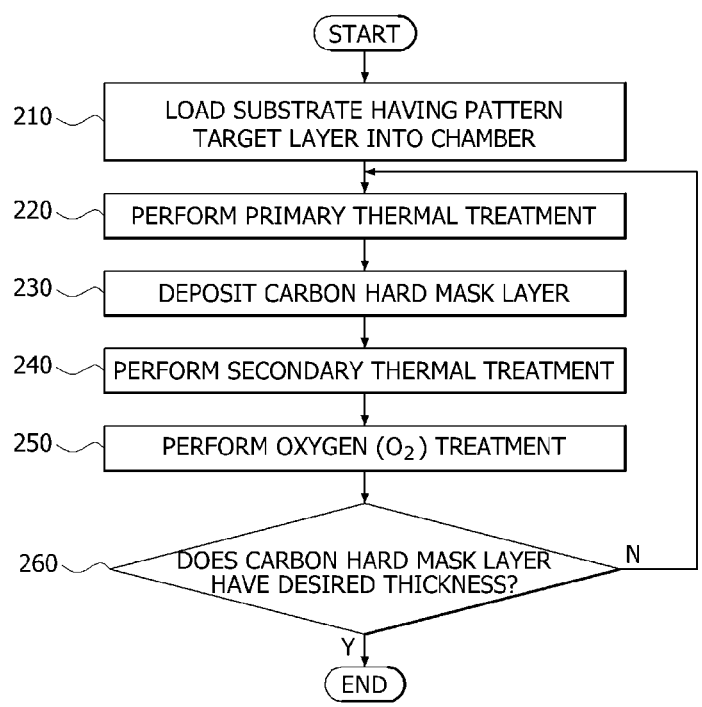
FIG. 2 is a flowchart explaining a method for fabricating a carbon hard mask layer according to an embodiment of the present invention.
Figure 3:
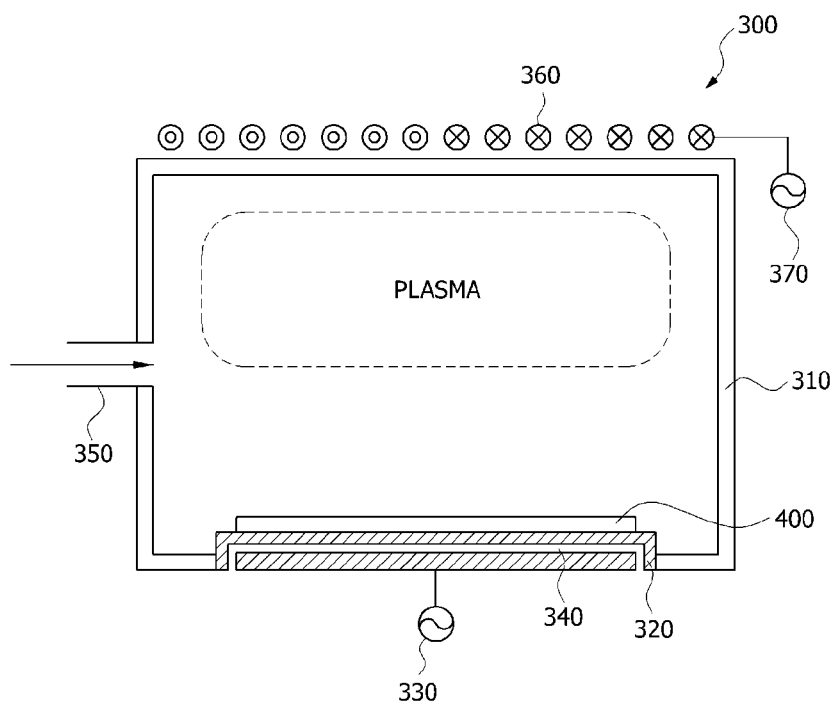
FIG. 3 is a schematic view of a plasma chamber used in the method for fabricating a carbon hard mask layer according to the embodiment of the present invention.

FIG. 2 is a flowchart explaining a method for fabricating a carbon hard mask layer according to an embodiment of the present invention. FIG. 3 is a schematic view of a high density plasma (HDP) chamber used in the method for fabricating a carbon hard mask layer according to the embodiment of the present invention. Also, FIGS. 4 to 14 are detailed views explaining a method for fabricating a carbon hard mask layer and a method for fabricating patterns of a semiconductor device using the same.

Referring to FIG. 2, a substrate having a pattern target layer is loaded into a chamber (step 210). The chamber is a plasma chamber, and in particular, an HDP chamber. The HDP chamber will be described in detail with reference to FIG. 3. After the substrate having the pattern target layer is loaded into the chamber, a primary thermal treatment is performed (step 220). After the primary thermal treatment, a carbon hard mask layer is deposited (step 230). After the first carbon hard mask layer is deposited, a second thermal treatment is performed (step 240). After the second thermal treatment, an oxygen ($O_2$) treatment is performed (step 250).

After the hydrogen component within the first carbon hard mask layer is sufficiently removed by the oxygen ($O_2$) treatment, it is determined whether or not the first carbon hard mask layer is sufficiently thick (step 260). If the thickness of the first carbon hard mask layer is the desired thickness, the process of depositing the carbon hard mask layer is completed. If the thickness of the first carbon hard mask layer is less than the desired thickness, the steps 220 to step 250 are repeated. These steps are described in more detail with respect to FIGS. 3-14.

Referring to FIG. 3, the HDP chamber 300 has a reaction space defined by a chamber outer wall 310. A chuck 320 supporting a substrate 400 is disposed on the bottom of the HDP chamber 300. The chuck 320 may be an electrostatic chuck, however, the present invention is not limited thereto. For example, the chuck may be a mechanical chuck, a magnetic chuck, a vacuum chuck, or other appropriate chuck. The chuck 320 is coupled to a bias power source 330. A cooling passage 340 is disposed inside the chuck 320. If necessary, the temperature of the substrate 400 can be lowered by supplying a fluid such as, for example, helium (He), into the cooling passage 340. A gas supply port 350 is disposed in one side of the chamber outer wall 310. As indicated by an arrow, a reaction gas is supplied into the HDP chamber 300 through the gas supply port 350. A coil 360 as an inductively coupled plasma (ICP) source is disposed above the HDP chamber 300. In some cases, instead of the ICP source, a capacitively coupled plasma (CCP) source may be used. The coil 360 is coupled to an RF power source 370. When a high frequency RF power is applied from the RF power source 370, plasma is formed within the HDP chamber 300.

Figure 4:
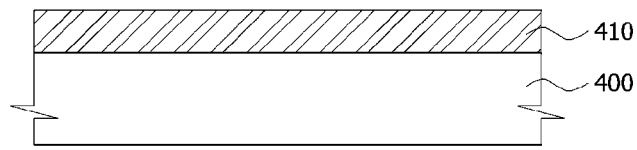
FIGS. 4 to 14 are detailed views explaining a method for fabricating a carbon hard mask layer and a method for fabricating patterns of a semiconductor device using the same.

As illustrated in FIG. 4, a target loaded into the HDP chamber 300 is a semiconductor substrate 400 in which a pattern target layer 410 is formed. The semiconductor substrate 400 is a silicon substrate; however, the present invention is not limited thereto. In some cases, the semiconductor substrate 400 may be a silicon-on-insulator (SOI) substrate, or a substrate made of a material other than silicon. Although it is illustrated that the semiconductor substrate 400 and the pattern target layer 410 are directly contacted with each other, it is merely exemplary as at least one layer may be disposed between the semiconductor substrate 400 and the pattern target layer 410. In addition, the pattern target layer 410 in this embodiment is a layer separate from the semiconductor substrate 400, but a portion of the semiconductor substrate 400 may be the pattern target layer.

Figure 5:
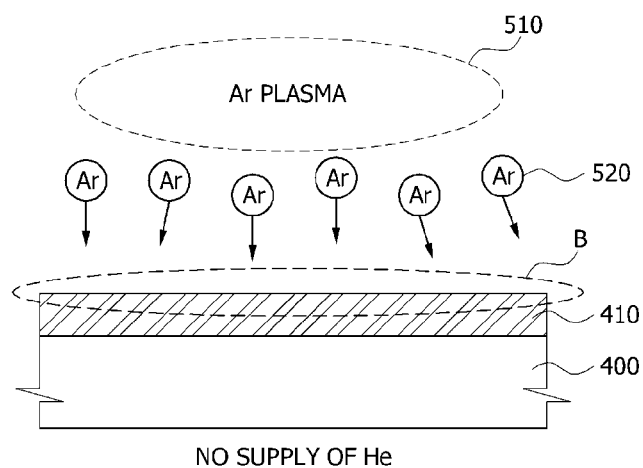

After the substrate 400 having the pattern target layer 410 is loaded into the chamber 300, a primary thermal treatment is performed (step 220). That is, as illustrated in FIG. 5, plasma 510 containing ions or radicals is formed within the HDP chamber 300 (FIG. 3). To this end, a plasma forming gas is supplied into the HDP chamber 300, RF power of about 4,000-15,000 W is applied to the coil 360 (FIG. 3). Since this step raises the temperature of the surface of the pattern target layer 410 to above a predetermined level, the bias power from the bias power source 330 (FIG. 3) is not applied. Argon (Ar) gas may be used as the plasma forming gas. According to circumstances, gas which does not substantially react with the pattern target layer 410, for example, $N_2$, $NH_3$ or $N_2O$, may be used as the plasma forming gas. In some cases, at least two gases may be used together.

As indicated by arrows, argons (Ar) 520 within the plasma 510 collide with the pattern target layer 410 and increase the temperature of the surface B of the pattern target layer 410. In order to raise the temperature of the surface B of the pattern target layer 410 to a desired level, a cooling fluid such as, for example, helium (He), may not be supplied to the cooling passage 340 inside the chuck 320 of the HDP chamber 300.

When the temperature of the surface B of the pattern target layer 410 is raised, hydrogen bonding is suppressed when a carbon hard mask layer begins to be deposited in a subsequent process. To this end, the temperature of the surface B of the pattern target layer 410 is raised to above at least 550° C. When the temperature is below 550° C., the effect that suppresses generation of hydrogen bonding is reduced with respect to when the temperature is above 550° C. Although the effect that suppresses the generation of hydrogen bonding is increased as the temperature of the surface B of the pattern target layer 410 is higher, unwanted change may occur in the layer material characteristic of the pattern target layer 410 when the temperature of the surface B of the pattern target layer 410 is above a specific level.

Therefore, the upper limit of temperature may vary depending on a material of the pattern target layer 410. As one example, in a case in which the pattern target layer 410 is formed of tungsten (W), the temperature of the surface B of the pattern target layer 410 is adjusted to about 800° C. or less. This is because the pattern target layer 410 formed of tungsten (W) may oxidize when the temperature of the surface B of the pattern target layer 410 is above 800° C. As another example, in a case in which the pattern target layer 410 is formed of titanium nitride (TiN), the temperature of the surface B of the pattern target layer 410 is adjusted to about 700° C. or less. This is because the pattern target layer 410 formed of titanium nitride (TiN) may be silicided by the reaction with adjacent silicon when the temperature of the surface B of the pattern target layer 410 is above 700° C.

Figure 6:
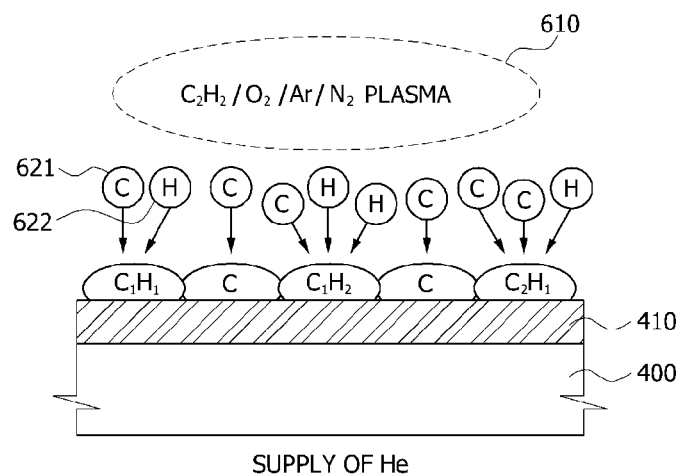

After the primary thermal treatment, a carbon hard mask layer is deposited (step 230). As illustrated in FIG. 6, the deposition of the carbon hard mask pattern is performed by applying high RF power of about 4,000-15,000 W from the RF power source 370 (FIG. 3) while $C_2H_2$ and $O_2$ gases as a reaction gas and Ar and $N_2$ gas as an activation gas are supplied into the HDP chamber 300. $C_2H_2/O_2/Ar/N_2$ plasma 610 is formed within the HDP chamber 300. As the $C_2H_2/O_2/Ar/N_2$ plasma 610 is formed, carbon (C) 621 and hydrogen (H) 622 are attracted to the surface of the pattern target layer 410, as indicated by arrows. As a result, carbon (C) C—H bonded compounds (CH, $CH_2$, $C_2H$, ...) are deposited on the surface of the pattern target layer 410. Instead of $C_2H_2$, other $C_xH_y$, for example, $C_3H_6$ or $C_5H_8$, may be used as the reaction gas.

In addition, one of Ar and $N_2$ may not be supplied to form the plasma 610. In the process of depositing the carbon hard mask layer, carbon (C) 621 and hydrogen (H) 622 collide with the surface of the pattern target layer 410 and thus the temperature of the substrate 400 continuously rises. Therefore, in this case, the substrate 400 is cooled not to be excessively high by supplying, for example, helium (He) through the cooling passage 340 inside the chuck 320 supporting the substrate 400. The temperature adjustment of the substrate 400 by the supply of, for example, helium (He) is appropriately performed to the extent that does not influence other layer materials (not shown) on the substrate 400.

Figure 7:
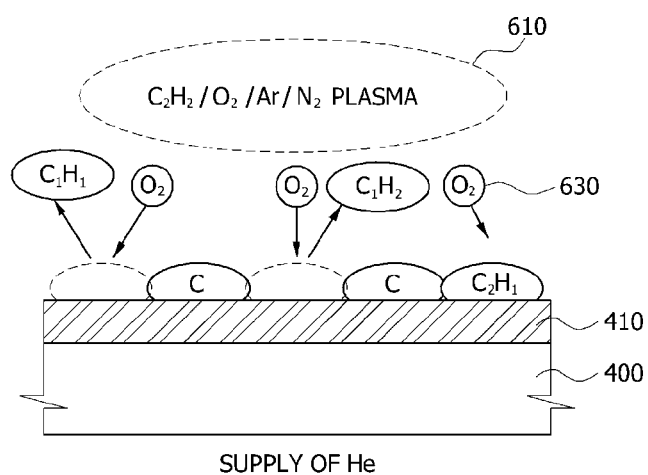

As illustrated in FIG. 7, while carbon (C) 621 and hydrogen (H) 622 are deposited on the surface of the pattern target layer 410, etching phenomenon caused by oxygen ($O_2$) 630 also occurs. The oxygen ($O_2$) 630 reacts with the deposited carbon (C) or the C—H bonded compounds (CH, $CH_2$, $C_2H$, ...), causing the etching phenomenon. At this time, since the reactivity between the oxygen ($O_2$) 630 and the hydrogen (H) is higher than the reactivity between the oxygen ($O_2$) 630 and the carbon (C), the oxygen ($O_2$) 630 removes the C—H bonded compounds (CH, $CH_2$, $C_2H$, ...) rather than the compound deposited with only carbon (C).

As described above with reference to FIGS. 6 and 7, in the step 230 of depositing the carbon hard mask layer, the deposition and the etching are performed at the same time. Thus, if the deposition rate and/or the etching rate are/is not appropriately adjusted, a very small amount of carbon (C) is deposited. Therefore, in this case, the etching rate should be adjusted not to be higher than the deposition rate. The adjustment of the etching rate is achieved by controlling the bias power applied from the bias power source 330. The etching rate at which the oxygen ($O_2$) 630 removes carbon (C) or C—H bonded compounds deposited on the pattern target layer 410 is proportional to the bias power. That is, if high bias power is applied, a large number of the oxygen ($O_2$) 630 has energy exceeding a threshold barrier. Accordingly, a large number of the oxygen ($O_2$) 630 contributes to the etching. Therefore, in this embodiment, the bias power is appropriately controlled so that the etching rate is not higher than the deposition rate. As one example, in a case in which the RF power of about 4,000-15,000 W is applied, a bias power of about 1,000-2,000 W may be applied.

Figure 8:
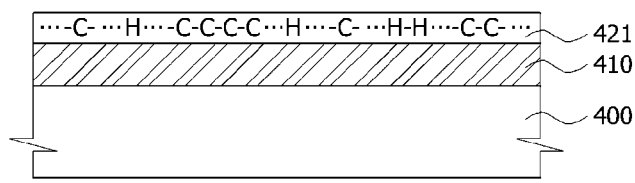

FIG. 8 illustrates a first carbon hard mask layer 421 formed through the step 230 of depositing the carbon hard mask layer. As illustrated in FIG. 8, a first carbon hard mask layer 421 is formed on the pattern target layer 410. The first carbon hard mask layer 421 includes C—C bonding, C—H bonding, and H—H bonding. Hydrogen (H) existing within the first carbon hard mask layer 421 is an H remnant component which is not removed by the oxygen ($O_2$) 630 and remains within the first carbon hard mask layer 421 in the step of depositing the carbon hard mask layer.

Figure 9:
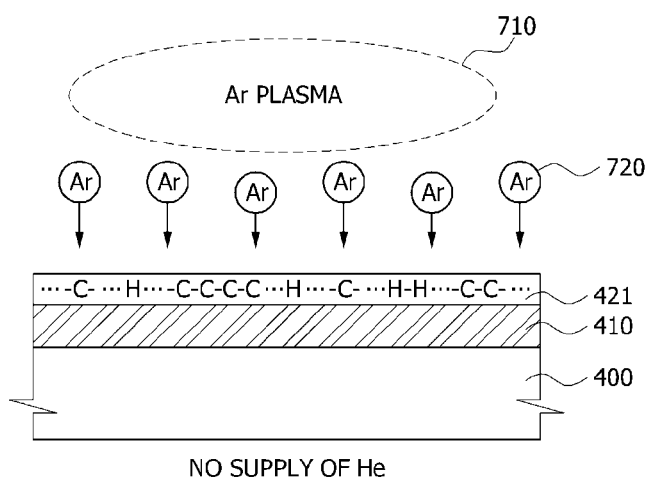

As illustrated in FIG. 9, after the first carbon hard mask layer is deposited, a secondary thermal treatment is performed (step 240). That is, plasma 710 containing ions or radicals is formed within the HDP chamber 300. To this end, a plasma forming gas is supplied into the HDP chamber 300, and RF power of about 4,000-15,000 W is applied to the coil 360.

Since the secondary thermal treatment in this step is done for raising the temperature of the first carbon hard mask layer 421, bias power from the bias power source 330 is not applied. Argon (Ar) gas is used as the plasma forming gas. According to circumstances, gas which does not substantially react with the pattern target layer 410 and the first carbon hard mask layer 421, for example, $N_2$, $NH_3$ or $N_2O$, may be used as the plasma forming gas. In this case, at least two gases may be used together. As indicated by arrows, a part of argons (Ar) 720 within the plasma 710 collide with the first carbon hard mask layer 421 and raises the temperature of the first carbon hard mask layer 421. In order to raise the temperature of the first carbon hard mask layer 421 to a desired level, no helium (He) is supplied to the cooling passage 340 inside the chuck 320 of the HDP chamber 300.

As the secondary thermal treatment is performed on the first carbon hard mask layer 421, the temperature of the first carbon hard mask layer 421 is raised. Therefore, energy which can cut the hydrogen bonding within the first carbon hard mask layer 421 is applied to the first carbon hard mask layer 421. As one example, the temperature of the first carbon hard mask layer 421 is adjusted to at least 550° C. or more. When the temperature is below 550° C., the effect of supplying the energy for cutting the hydrogen bonding is reduced. In the secondary thermal treatment, the upper limit of temperature is determined depending on a material of the pattern target layer 410, as in the case of the primary thermal treatment. As one example, in a case in which the pattern target layer 410 is formed of tungsten (W), the temperature of the first carbon hard mask layer 421 is adjusted to about 800° C. or less. As another example, in a case in which the pattern target layer 410 is formed of titanium nitride (TiN), the temperature of the first carbon hard mask layer 421 is adjusted to about 700° C. or less.

Figure 10:
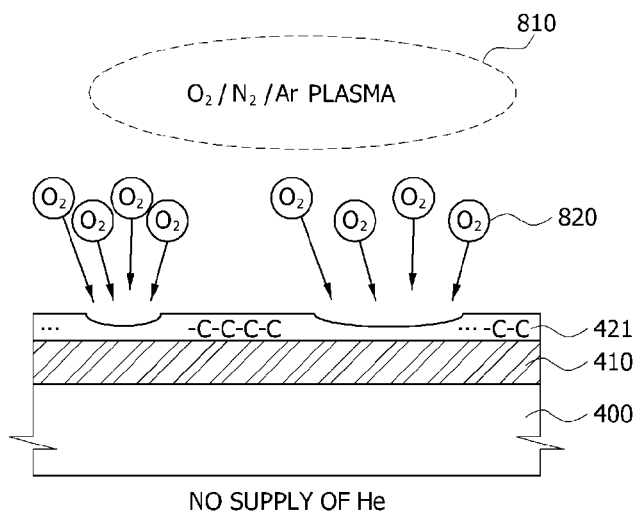

As illustrated in FIG. 10, after the second thermal treatment, an oxygen ($O_2$) treatment is performed (step 250). Specifically, high RF power of about 4,000-15,000 W is applied from the RF power source 370, while $O_2$ gas is supplied as a reaction gas and Ar and $N_2$ gases are supplied as activation gases in to the HDP chamber 300. $O_2/Ar/N_2$ plasma 810 is formed within the HDP chamber 300. As the $O_2/Ar/N_2$ plasma 810 is formed, oxygen ($O_2$) 820 reacts with the C—H bonded type (CH, $CH_2$, $C_2H$, ...) components in the first carbon hard mask layer 421, and an etching occurs to remove the C—H bonded compounds (CH, $CH_2$, $C_2H$, ...).

At this time, since the reactivity between the oxygen ($O_2$) 820 and the hydrogen (H) is higher than the reactivity between the oxygen ($O_2$) 820 and the carbon (C), the oxygen ($O_2$) 820 further contributes to removing the C—H bonded compounds (CH, $CH_2$, $C_2H$, ...) rather than the compound deposited with only carbon (C). While the oxygen ($O_2$) treatment is performed, the etching rate by the oxygen ($O_2$) 820 is adjusted so that the carbon (C) within the first carbon hard mask layer 421 is not excessively removed. The etching rate is proportional to the bias power. Thus, as one example, when RF power of about 4,000-15,000 W is applied, a bias power of about 300-1,000 W is applied. In addition, while the oxygen ($O_2$) treatment is performed, no helium (He) is supplied through the cooling passage 340 within the chuck 320 of the HDP chamber 300.

Figure 11:
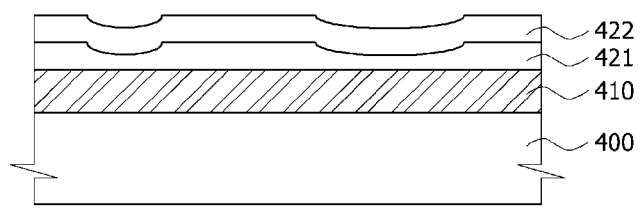

After the hydrogen component within the first carbon hard mask layer 421 is sufficiently removed by the oxygen ($O_2$) treatment, it is determined whether or not the first carbon hard mask layer 421 is sufficiently thick (step 260). When the thickness of the first carbon hard mask layer 421 is the desired thickness of the carbon hard mask layer, the process of depositing the carbon hard mask layer is completed. On the other hand, when the thickness of the first carbon hard mask layer 421 is less than the desired thickness of the carbon hard mask layer, the processes from step 220 of performing the primary thermal treatment to step 250 of performing the oxygen ($O_2$) treatment are repeated. As illustrated in FIG. 11, a second carbon hard mask layer 422 is formed on the first carbon hard mask layer 421 by the repetition of steps 220 to 250. Such processes are repeated until the carbon hard mask layer has the desired thickness.

Figure 12:
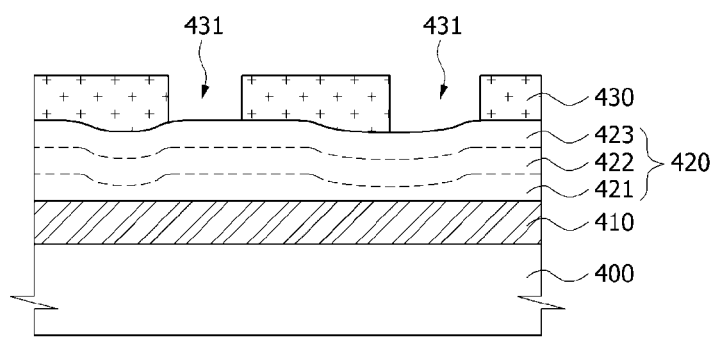

FIG. 12 illustrates when steps 220 to 250 are repeated three times to form the carbon hard mask layer 420 including the first carbon hard mask layer 421, the second carbon hard mask layer 422, and the third carbon hard mask layer 423.

After the carbon hard mask layer 420 is formed, an etching mask pattern 430 is formed on the carbon hard mask layer 420 in order to pattern the carbon hard mask layer 420. As described above with reference to FIGS. 2 to 11, the hydrogen (H) components within the carbon hard mask layer 420 are greatly reduced. Since the tolerance to the subsequent thermal treatment and etching process is increased, the carbon hard mask layer 420 can be formed sufficiently thinly. As one example, the etching mask pattern 430 is formed of silicon oxynitride (SiON). The etching mask pattern 430 has an opening 431 exposing a portion of the surface of the carbon hard mask layer 420.

Figure 13:
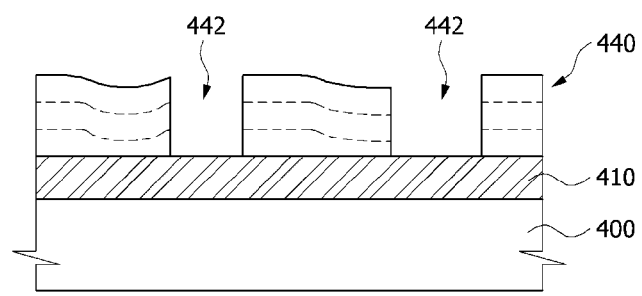
Figure 14:
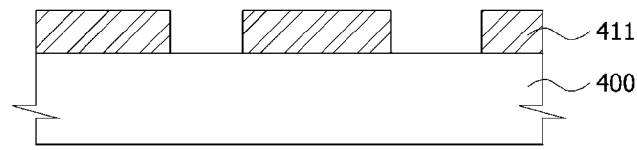

An etching process using the etching mask pattern 430 is performed to remove the exposed portion of the carbon hard mask layer 420. This etching process may be performed using, for example, oxygen ($O_2$) gas. As illustrated in FIG. 13, due to the etching process, a carbon hard mask pattern 440 having an opening 442 exposing a portion of the surface of the pattern target layer 410 is formed on the pattern target layer 410. The exposed portion of the pattern target layer 410 is removed by performing an etching process using the carbon hard mask pattern 440 as an etching barrier layer. As illustrated in FIG. 14, due to this etching process, a final pattern 411 is formed. At this time, in the etching process for forming the final pattern 411, an amount of the hydrogen (H) components coming out of the carbon hard mask pattern 440 by the etching process is reduced. After the final pattern 411 is formed, the carbon hard mask pattern 440 is removed. The removal of the carbon hard mask pattern 440 may be performed using, for example, oxygen ($O_2$) gas.

In accordance with the exemplary embodiments of the present invention, by reducing the hydrogen (H) components within the carbon hard mask layer, it is possible to reduce the amount of the hydrogen (H) components coming out of the carbon hard mask layer during the subsequent thermal treatment or etching process. As such, since the tolerance to the subsequent thermal treatment or etching process is increased, the pattern target layer can be patterned using thinner carbon hard mask layer. By reducing the hydrogen (H) components, it may also be possible to prevent the layer disposed above the carbon hard mask layer from being lifted by the hydrogen (H) components.

The embodiments of the present invention have been disclosed above for illustrative purposes. Those skilled in the art will appreciate that various modifications, additions, and substitutions are possible, without departing from the scope and spirit of the invention as disclosed in the accompanying claims.

What is claimed is:

1. A method for fabricating a carbon hard mask layer, the method comprising:
   loading a substrate with a pattern target layer into a chamber;
   performing a primary thermal treatment on the substrate;
   depositing a carbon hard mask layer over the pattern target layer by using $C_xH_y$ gas to perform the primary thermal treatment, wherein the carbon hard mask layer includes a C—H bonding and a C—C bonding;
   performing a secondary thermal treatment on the substrate on which the carbon hard mask layer is deposited, thereby generating energy to cut the C—H bonding of the carbon hard mask layer; and
   performing an oxygen treatment on the carbon hard mask layer which removes more of the C—H bonding than the C—C bonding.

2. The method of claim 1, wherein the chamber comprises a high density plasma (HDP) chamber.

3. The method of claim 2, wherein the HDP chamber comprises:
a cooling passage configured to cool the substrate; and
a chuck connected to an external bias power source.

4. The method of claim 1, wherein the primary thermal treatment is performed by introducing plasma to a surface of the pattern target layer.

5. The method of claim 4, wherein the plasma comprises at least one of $N_2$, Ar, $NH_3$, and $N_2O$ ions and/or radicals.

6. The method of claim 1, wherein the primary thermal treatment is performed so that the temperature of the surface of the pattern target layer becomes about 550-800° C.

7. The method of claim 1, wherein the primary thermal treatment is performed so that the temperature of the surface of the pattern target layer becomes about 550-700° C.

8. The method of claim 1, wherein the depositing of the carbon hard mask layer is performed using a reaction gas comprising at least one of $C_xH_y$ and $O_2$ and an activation gas comprising at least one of Ar and $N_2$.

9. The method of claim 8, wherein the $C_xH_y$ gas as the reaction gas comprises at least one of $C_2H_2$, $C_3H_6$, and $C_5H_8$.

10. The method of claim 1, wherein the depositing of the carbon hard mask layer is performed by applying RF power of 4,000-15,000 W for forming plasma within the chamber, and applying bias power of 1,000-2,000 W for the substrate.

11. The method of claim 1, wherein the secondary thermal treatment is performed by introducing plasma with the surface of the pattern target layer.

12. The method of claim 11, wherein the plasma comprises at least one of $N_2$, Ar, $NH_3$, and $N_2O$ ions and/or radicals.

13. The method of claim 1, wherein the secondary thermal treatment is performed so that the temperature of the surface of the pattern target layer becomes about 550-800° C.

14. The method of claim 1, wherein the secondary thermal treatment is performed so that the temperature of the surface of the pattern target layer becomes about 550-700° C.

15. The method of claim 1, wherein the depositing of the carbon hard mask layer is performed using a reaction gas comprising at least one of $C_xH_y$ and $O_2$ and an activation gas comprising at least one of Ar and $N_2$.

16. The method of claim 1, wherein the oxygen treatment is performed by applying RF power of 4,000-15,000 W for forming plasma within the chamber, and applying bias power of 300-1,000 W for the substrate.

17. The method of claim 1, wherein the depositing of the carbon hard mask layer is performed such that a carbon (C) deposition rate by the $C_xH_y$ gas is higher than a carbon (C) etching rate by the $O_2$ gas during the oxygen treatment.

18. The method of claim 1, wherein the primary thermal treatment, the secondary thermal treatment, and the oxygen treatment are repeated until a desired thickness of the carbon hard mask layer is obtained.

19. A method for fabricating patterns of a semiconductor device, the method comprising:
loading a substrate with a pattern target layer into a chamber;
performing a primary thermal treatment on the substrate;
depositing a carbon hard mask layer over the pattern target layer by using $C_xH_y$ gas;
performing a secondary thermal treatment on the substrate in which the carbon hard mask layer is deposited;
performing an oxygen treatment on the carbon hard mask layer;
repeating the primary thermal treatment, the secondary thermal treatment, and the oxygen treatment until a desired thickness of the carbon hard mask layer is obtained;
forming an etching mask pattern over the carbon hard mask layer;
forming a carbon hard mask pattern exposing a portion of the surface of the pattern target layer through an etching process using the etching mask pattern as an etching barrier layer; and
forming a final pattern by removing the exposed portion of the pattern target layer through an etching process using the carbon hard mask pattern as an etching barrier layer.

20. The method of claim 19, wherein the depositing of the carbon hard mask layer is performed using a reaction gas comprising at least one of $C_xH_y$ and $O_2$ and an activation gas comprising at least one of Ar and $N_2$.

* * * * *